United States Patent
Yeo et al.

(10) Patent No.: US 6,835,967 B2
(45) Date of Patent: Dec. 28, 2004

(54) SEMICONDUCTOR DIODES WITH FIN STRUCTURE

(75) Inventors: Yee-Chia Yeo, Hsinchu (TW); Fu-Liang Yang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/400,002

(22) Filed: Mar. 25, 2003

(65) Prior Publication Data

US 2004/0188705 A1 Sep. 30, 2004

(51) Int. Cl.$^7$ .............................................. H01L 29/885
(52) U.S. Cl. ...................... 257/104; 257/594; 257/623; 257/624
(58) Field of Search ................................ 257/104, 623, 257/624, 594

(56) References Cited

U.S. PATENT DOCUMENTS

| | | | | |
|---|---|---|---|---|
| 4,143,383 A | * | 3/1979 | Van Rooij et al. | 257/601 |
| 4,571,559 A | * | 2/1986 | Henry et al. | 333/17.2 |
| 5,140,651 A | * | 8/1992 | Soref et al. | 385/2 |
| 5,272,370 A | * | 12/1993 | French | 257/353 |
| 5,341,016 A | * | 8/1994 | Prall et al. | 257/412 |
| 6,645,820 B1 | * | 11/2003 | Peng et al. | 438/372 |

* cited by examiner

*Primary Examiner*—Jerome Jackson
(74) *Attorney, Agent, or Firm*—Tung & Associates

(57) ABSTRACT

A semiconductor diode structure is provided which includes a substrate; a fin formed of a semiconducting material positioned vertically on the substrate, the fin includes a first heavily-doped region of a first doping type on one side and a second heavily-doped region of a second doping type on an opposite side; and a first conductor contacting the first heavily-doped region and a second conductor contacting the second heavily-doped region.

66 Claims, 3 Drawing Sheets

SEMICONDUCTOR DIODES WITH FIN STRUCTURE

FIELD OF THE INVENTION

The present invention generally relates to the field of semiconductor devices, and more specifically, to a semiconductor diode device for electrostatic discharge protection in advanced complementary metal-oxide-semiconductor (CMOS) technologies. The semiconductor diode provided by this invention is compatible with the fabrication process of advanced transistors such as multiple-gate-transistors.

BACKGROUND OF THE INVENTION

Size reduction of the metal-oxide-semiconductor field-effect transistor (MOSFET) has enabled the continued improvement in speed performance, density, and cost per unit function of integrated circuits over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel. Phenomena such as reduced gate control associated with transistors with short channel lengths are termed short-channel effects. Increased body doping concentration, reduced gate oxide thickness, and ultra-shallow source/drain junctions are ways to suppress short-channel effects.

When the gate length is scaled down into the sub-50 nanometer (nm) regime, the requirements for body-doping concentration, gate oxide thickness, and source/drain (S/D) doping profiles to control short-channel effects become increasingly difficult to meet when conventional device structures based on bulk silicon (Si) substrates are employed. For device scaling well into the sub-50 nm regime, a promising approach to controlling short-channel effects is to use an alternative device structure with multiple-gates, such as the double-gate structure and triple-gate structures. The multiple-gate transistor structure is expected to extend the scalability of CMOS technology beyond the limitations of the conventional bulk MOSFET. The introduction of additional gates improves the capacitance coupling between the gates and the channel, increases the control of the channel potential by the gate, helps suppress short channel effects, and prolongs the scalability of the MOS transistor.

FIG. 1A shows an enlarged, cross-sectional view of a conventional diode structure 10 fabricated on bulk silicon substrate 12. FIG. 1B shows an enlarged, cross-sectional view of a conventional diode structure 20 fabricated on an silicon-on-insulator (SOI) wafer 22, also known as a lateral unidirectional bipolar insulated gate type transistor (or lubistor). In both these structures, the n+ and p+ regions 14,16 are formed on the opposite sides of the polysilicon (poly-Si) gate stack 18. The n+ and p+ regions 14,16 in the substrate 12,22 are used as the two terminals of the diode. The poly-Si gate stack 18 in the structures of FIGS. 1A and 1B may be connected to the cathode (n+ region of the poly-Si), for example.

Most of the work on advanced device structures such as the multiple-gate transistors focus on the transistor structure and method of fabrication. There is little or no work on the provision of electrostatic discharge protection for these nanoscale devices. Transistor size reduction has resulted in the thinning of insulator layers such as the gate dielectric layer. These thinner dielectric layers fail at lower voltages. Consequently, device scaling increases circuit sensitivity to voltage stress, electrical overstress (EOS), and electrostatic discharge (ESD). These types of failures are a major concern in advanced semiconductor technology. This is especially true for integrated circuit (IC) chips that interface with other chips or signals with voltages above that of the IC chip itself. IC chips usually include protection devices or diodes in interface circuits to provide the IC chip with added ESD protection. U.S. Pat. No. 5,629,544, entitled "Semiconductor diode with silicide films and trench isolation", issued to Voldman et al, teaches the use of diode structures bound by polysilicon for bulk silicon and silicon-on-insulator (SOI) MOSFET applications. U.S. Pat. Nos. 6,015,993 and 6,232,163B1, both issued to Voldman et al, discuss a high voltage tolerant diode structure for mixed-voltage and mixed signal and analog/digital applications. These prior arts are applicable to bulk and SOI transistor technologies. For future advanced technologies that employ device structures such as the multiple-gate transistors, new electrostatic discharge protection elements that are more advanced with improved characteristics should be used to provide superior voltage protection for nanoscale devices.

Semiconductor diodes used for ESD protection should have low series resistance, low sub-threshold leakage, and low reverse leakage. The series resistance is the most important factor for achieving good ESD performance. ESD protection levels improves with reduction in diode series resistance. The series resistance characteristic is especially important in a mixed voltage environment where diode strings are used and where the series resistance of each diode add to degrade ESD performance. Diode resistance is largely determined by the size of the diode, the resistivity of the material constituting the diode body, the distance of the current path, and the resistance of silicide films or contacts to n+ and p+ diffusions. Thus, a wider diode with a lower body resistivity, a shorter current path, and silicided films and contacts provide a lower diode series resistance.

It is therefore an object of the present invention to provide a semiconductor diode for electrostatic discharge protection.

It is another object of the present invention to provide a semiconductor diode that is compatible with a fabrication process of advanced transistors such as multiple-gate transistors.

It is a further object of the present invention to provide a semiconductor diode equipped with contacts on the sidewalls of the silicon body.

It is another further object of the present invention to provide a semiconductor diode with improved area efficiency.

It is still another object of the present invention to provide a n+/p+ tunnel diode with a fin structure.

SUMMARY OF THE INVENTION

In accordance with the present invention, a semiconductor diode structure and a semiconductor diode string are provided.

In a preferred embodiment, a semiconductor diode structure is provided which includes a substrate; a fin formed of a semiconducting material positioned vertically on the substrate, the fin includes a first heavily-doped region of a first doping type on one side and a second heavily-doped region of a second doping type on an opposite side; and a first conductor contacting the first heavily-doped region and a second conductor contacting In the semiconductor diode structure, the semiconducting material may include silicon, or may include silicon and germanium, or may include a compound semiconductor. The substrate may include a layer of an insulating material, wherein the insulating material may be silicon oxide, or may be a dielectric selected from silicon nitride and aluminum oxide. The first doping type may be formed by using n-type dopant selected from phosphorus, arsenic and antimony. The second heavily-doped region of the second doping type may be formed by using p-typed dopant selected from the group boron and indium. The first and the second conductor may be formed of a material such as tungsten or copper, or may be formed of a metallic nitride of titanium nitride or tantalum nitride, or may be formed of a heavily-doped semiconducting material, or may be formed of p+ doped polysilicon. The first and the second conductor may further include a first conductive layer underlying a second conductive layer, wherein the first conductive layer may be titanium nitride and the second conductive layer may be tungsten. The fin may have a width between about 50 angstroms and about 5000 angstroms, and a height greater than about 200 angstroms. The first doping type may be n+, while the second doping type may be p+ forming n+/p+ tunnel diode wherein a tunneling junction is formed between n+ and p+ regions. A dopant concentration in each of the n+ and p+ regions is greater than $10^{19}$ cm$^{-3}$ power. An etchant mask may overly the fin. The etchant mask may include a dielectric material of silicon oxide, silicon nitride or silicon nitride on a silicon oxide stack. A silicide is formed in the first heavily-doped region and the second heavily-doped region. The silicide may be titanium silicide, cobalt silicide, and nickel platinum silicide. A junction depth of the first and the second heavily-doped region may be greater than a silicide penetration depth by at least about 50 angstroms.

The present invention is further directed to a semiconductor diode structure which includes a substrate; a fin formed of a semiconducting material positioned vertically on the substrate, the fin includes a first heavily-doped region of a first doping type on one side and a second heavily-doped region of a second doping type on an opposite side, and a lightly-doped body region situated in-between the first heavily-doped region and the second heavily-doped region; and a first conductor contacting the first heavily-doped region and a second conductor contacting the second heavily-doped region.

In the semiconductor diode structure, the semiconducting material may be silicon, or may be silicon and germanium, or may be a compound semiconductor. The substrate may be a layer of an insulating material. The insulating material may be silicon oxide, or may be a dielectric such as silicon nitride and aluminum oxide. The first doping type may be formed by using n-type dopant of phosphorus, arsenic or antimony. The second heavily-doped region of the second doping type may be formed by using p-type dopant such as boron or indium. The first and the second conductor may be formed of a metal such as tungsten or copper, or may be formed of a metallic nitride such as titanium nitride or tantalum nitride, or may be formed of a heavily-doped semiconducting material, or may be formed of p+ doped polysilicon. The first and the second conductor may further include a first conductive layer underlying a second conductive layer, wherein the first conductive layer may be titanium nitride and the second conductive layer may be tungsten. The fin may have a width between about 50 angstroms and about 5000 angstroms, and a height of greater than about 200 angstroms.

In the semiconductor diode structure, an etchant mask may overly the fin, wherein the etchant mask may include a dielectric material such as silicon oxide, silicon nitride, or silicon nitride on a silicon oxide stack.

In the semiconductor diode structure, a silicide may be formed in the first heavily-doped region and the second heavily doped region. The silicide may be titanium silicide, cobalt silicide, nickel silicide or platinum silicide. A junction depth of the first and the second heavily-doped region may be greater than a silicide penetration depth by at least about 50 angstroms.

The present invention is still further directed to a semiconductor diode string which includes a substrate; a plurality of fins situated side-by-side on the substrate, each formed of a semiconducting material and each having a first heavily-doped region of a first doping type on one side and a second heavily-doped region of a second doping type on an opposite side; and a conductor contacting the first heavily-doped region in each of the plurality of fins and the second heavily doped region of an adjacent fin.

In the semiconductor diode string, the semiconducting material may be silicon, may be silicon and germanium, or may be a compound semiconductor. The substrate may be a layer of an insulating material, wherein the insulating material may be silicon oxide, or may be a dielectric such as silicon nitride and aluminum oxide. The first doping type is formed by using n-type dopant such as phosphorus, arsenic or antimony. The second heavily-doped region of the second doping type is formed by using t-type dopant such as boron or indium. The first and the second conductor may be formed of a metal such as tungsten or copper, or formed of a metallic nitride such as titanium nitride or tantalum nitride, or may be formed of a heavily-doped semiconducting material, or may be formed of p+ doped polysilicon. The first and the second conductor may include a first conductive layer underlying a second conductive layer, wherein the first conductive layer is titanium nitride and the second conductive layer is tungsten. The fin has a width between about 50 angstroms and about 5000 angstroms, and a height greater than about 200 angstroms.

In the semiconductor diode string, an etchant mask overlies each one of the plurality of fins. The etchant mask may include a dielectric material such as silicon oxide, silicon nitride or silicon nitride on a silicon oxide stack. A silicide may be formed in the first heavily-doped region and the second heavily-doped region, wherein the silicide may be titanium silicide, cobalt silicide, nickel silicide or platinum silicide. A junction depth of the first or the second heavily-doped region may be greater than a silicide penetration depth by at least about 50 angstroms.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
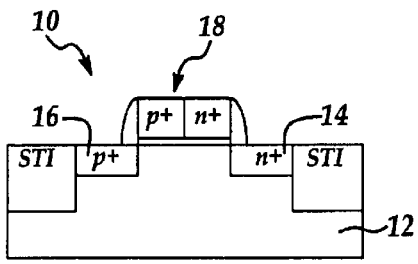
FIGS. 1A and 1B are enlarged, cross-sectional views of a conventional diode structure fabricated on bulk silicon substrate and on silicon-on-insulator substrate, respectively.
Figure 1B:
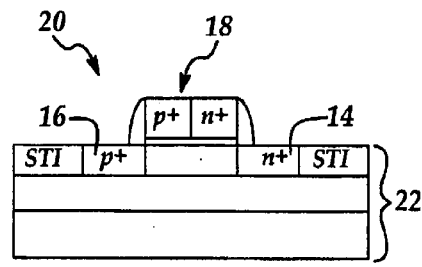
Figure 2A:
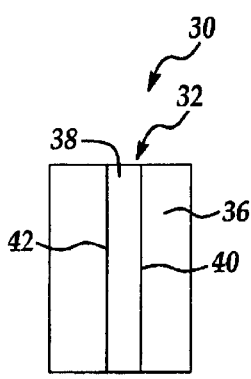
FIGS. 2A, 2B and 2C are enlarged, plane view and perspective views of the present invention preferred embodiment diode structure with and without a lightly-doped body region, respectively.
Figure 2B:
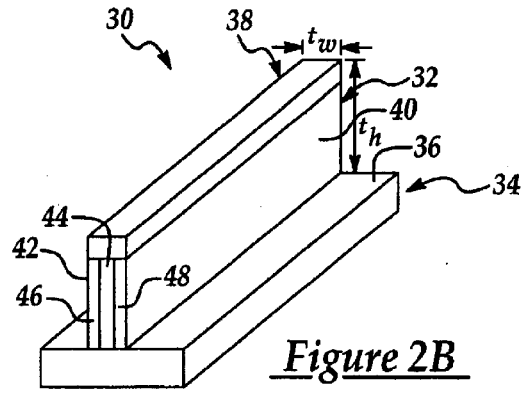

Referring now to FIGS. 2A and 2B, wherein a top view and a perspective view, respectively, of a preferred embodiment of the present invention are shown. The diode 30 comprises a semiconductor fin 32 overlying an substrate 34 with a surface 36 formed by an insulator. The semiconductor fin 32 extends vertically from an insulating substrate 34 with a height $t_h$ and a with $t_w$. The semiconductor fin 32 may be constituted by any semiconducting material, including elemental semiconductor such as silicon and germanium, alloy semiconductor such as silicon-germanium and silicon-germanium-carbon, and compound semiconductor such as indium phosphide and gallium arsenide. The semiconductor materials described may have a crystalline, a polycrystalline, or an amorphous structure. The semiconductor material overlies a substrate with a surface comprising an insulator. The insulator material may be, but is not limited to, silicon oxide, silicon nitride, or aluminum oxide. In the preferred embodiment, the semiconductor fin material is silicon and the underlying insulator is silicon oxide. The semiconductor fin may be defined or etched by an etchant mask 38 which may be formed of dielectric materials of silicon oxide or silicon nitride or a silicon nitride on silicon oxide stack.

In the preferred embodiment, the etchant mask 38 is silicon oxide. The semiconductor fin height $t_h$, as indicated in FIG. 2B, is typically larger than 200 angstroms. The fin width $t_w$, as indicated in FIG. 2B, is between 50 angstroms and 5,000 angstroms. The silicon fin sidewall surface 40 may be smoothened to improve or reduce the surface roughness of the fin sidewalls. This is performed by subjecting the fin to a sacrificial oxidation and silicon sidewall treatment (i.e. high temperature annealing at 1,000 degrees C. in $H_2$ ambient)

As shown in FIG. 2B, the semiconductor fin 32 is doped differently on the two sidewalls 40,42. one side 42 of the semiconductor fin 32 is doped heavily with n-type dopants such as phosphorus (P), arsenic (As), and antimony (Sb). This results in the formation of an n+ region 46. The other side 40 is doped heavily with p-type dopants such as boron (B) and indium (In), resulting in the formation of a p+ region 48. The n+ and p+ regions 46,48 of the two sidewalls 40,42 of the semiconductor fin 32 may encroach only slightly into the fin, as shown in FIG. 2B, leaving a body region 44 in the middle of the semiconductor fin 32 which may be doped n-type or p-type. In the structure of FIG. 2B, the diode is a n+/p diode if the body region 44 is doped p-type, and a p+/n diode if the body region 44 is doped n-type. The junction depth of the n+ or p+ regions 46,48, as indicated by $x_j$ in FIG. 2B, may vary from about 25 angstroms to about 1000 angstroms. The term "about used in this writing indicates a range of values that is +/−10% of the average value given.

Figure 2C:
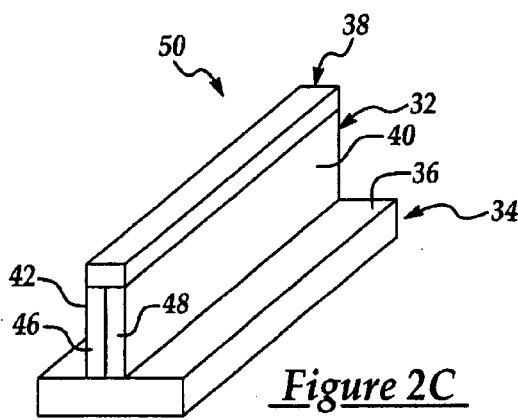

When the sum of the junction depths of the n+ and p+ regions 46,48 exceed the fin width, the body region 44 does not exist, and n+ and p+ regions 46,48 are therefore adjacent to each other. The diode is essentially a n+/p+diode or a tunnel diode 50, as schematically illustrated in FIG. 2C. For the formation of a tunnel diode 50, the doping concentration of the n+ and p+ regions 46,48 have to be so high that a tunneling junction is concentration in each of the n+ and p+ regions may be higher than $10^{19}$ $cm^{-3}$. Such a tunnel diode device is attractive on account of its steep current-voltage characteristic and especially with an improved reverse characteristic. Tunnel diodes with steep current-voltage characteristic in both the forward and reverse direction are useful in applications such as microwave amplification and switching at high speeds.

Figure 3A:
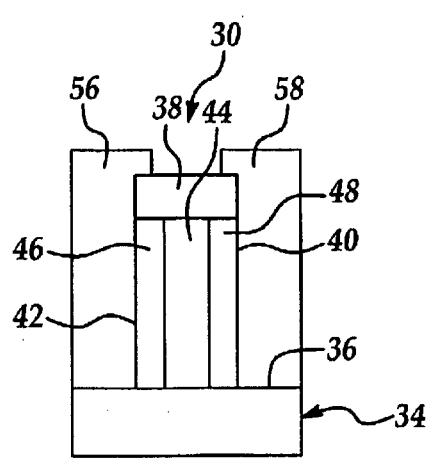
FIGS. 3A and 3B are enlarged, cross-sectional view and top view of a present invention semiconductor diode with a first and second conductors formed adjacent to the heavily-doped regions.
Figure 3B:
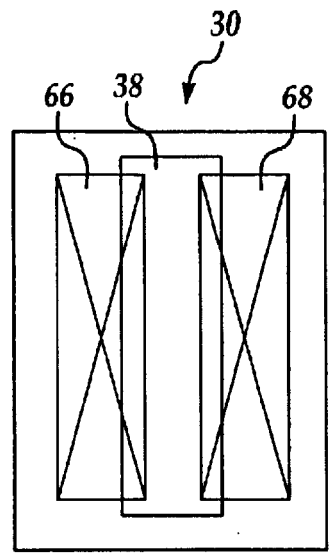
Figure 4:
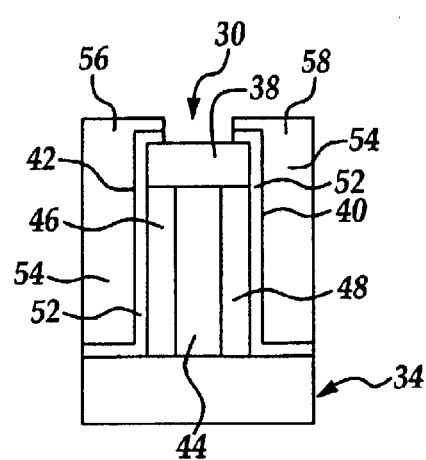
FIG. 4 is an enlarged, cross-sectional view of the present invention semiconductor diode structure wherein the conductors are formed of a first conductive material and a second conductive material.

The n+ and p+ regions 46,48 on the sidewall of the semiconductor fin 32 may be contacted by conductors 56,58, respectively, as shown in FIGS. 3A and 3B. A top view of the diode 30 illustrating the layout of the semiconductor fin mask 38 and the contact masks 66,68 is shown in FIG. 3B. The conductors 56,58 essentially straps around the sidewalls of the semiconductor fin 32. In one embodiment, the conductor in contact with the n+ and p+ regions 46,48 may be formed of a metal such as tungsten and copper. In another embodiment, the conductor may be formed of a metallic nitride such as titanium nitride or tantalum nitride. In yet another embodiment, the conductor may be formed of a heavily-doped semiconductor such as n+ doped polysilicon. The conductor may also be a combination or a multi-layer stack formed by materials selected from metallic nitrides, metals and heavily-doped semiconductors. For example, the conductor may be formed of a stack including a layer 52 of a first conductive material underlying a layer 54 of a second conductive material. This is illustrated in FIG. 4. The stack may be a tungsten on titanium-nitride stack.

In accordance with the present invention, the n+ and p+regions 46,48 may be silicided prior to the provision of the conductive material. In this case, the conductors 56,58 previously described will be in contact with the silicide material. The silicide may be a metallic silicide such as titanium silicide, cobalt silicide, nickel silicide, or platinum silicide. It is known that silicide can be responsible for penetration defects that increase forward and reverse diode leakage currents. The leakage arises if the metal silicide in any region of the diode 30 extends close to the junction depth. The provision of a silicide over the n+ and p+ regions potentially causes problems when the junction depths of the n+ or p+ regions decrease or when the silicide penetration depth increases. Thus, in designing the diode of the invention with a silicide contact, parameters such as the junction depth of the n+ and p+ regions as well as the silicide penetration depth are important.

Figure 5:
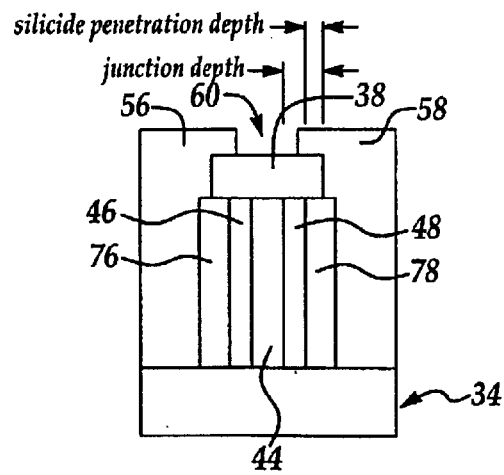
FIG. 5 is an enlarged, cross-sectional view of the present invention semiconductor diode structure wherein silicide is formed in the heavily-doped regions.

FIG. 5 shows the cross-section of a diode 60 with silicide contacts 76,78 to the n+ and p+ regions 46,48. The junction depth is defined to be the distance between the original semiconductor fin sidewall surface and the p+ or n+ junction. The silicide penetration depth is defined to be the distance between the original semiconductor fin sidewall surface and the interface between the silicide and the n+ or p+ region. The difference between the junction depth and the silicide penetration depth should be greater than 50 angstroms to avoid problems associated with silicide-related leakage. The silicide regions 76,78 may be in contact with a conductor 46,48, as shown in FIG. 5. In one embodiment, the silicide is cobalt silicide which may be formed by a cobalt silicidation process known and used in the art, i.e. comprising the steps of cobalt deposition, rapid thermal anneal, and cobalt removal/clean.

An advantage made possible by the present invention is the extremely short current path between the cathode and the anode, as compared to structures disclosed in prior art devices. Another advantage of the present invention is the close proximity of the cathode and anode contacts to the n+ and p+ regions, respectively. These advantages enable the diode structure provided by the present invention to achieve a very low series resistance for improved ESD protection for circuits.

Figure 6:
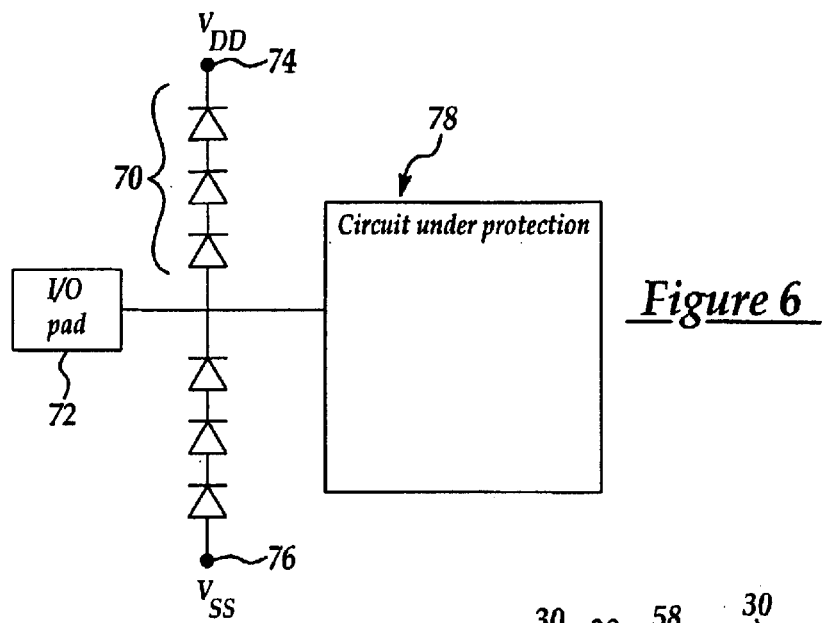
FIG. 6 is an illustration of a present invention semiconductor diode string.
Figure 7A:
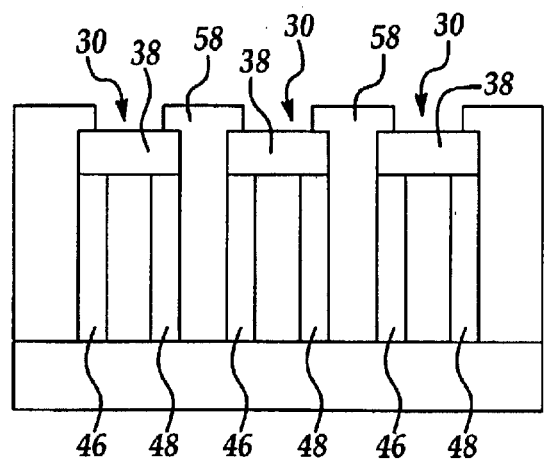
FIGS. 7A and 7B are enlarged, cross-sectional view and plane view of a present invention semiconductor diode string formed by a series collection of diodes.
Figure 7B:
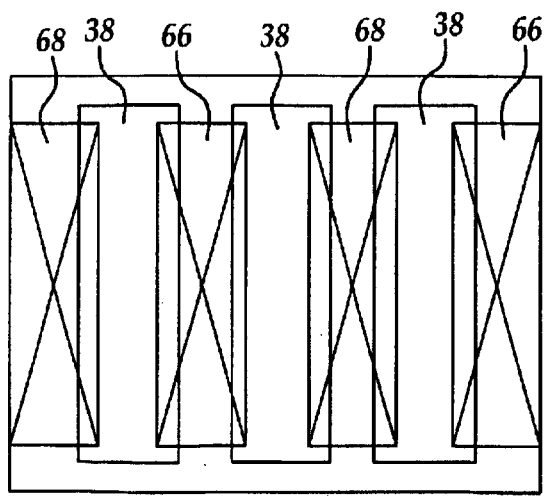

Using the device structure illustrated in FIG. 3, diode strings may be formed. Diode strings are used in input/output protection circuits as well as global voltage protection circuits. For example, for input/output circuit protection, diode strings 70 connect the input/output pad 72 to the power supply lines $V_{DD}$ 74 and $V_{SS}$ 76, as shown in FIG. 6. when a positive voltage spike is applied to the input/output pad 72 during an ESD event, the diode string 70 connecting the input/output pad 72 to $V_{DD}$ 74 is forward biased, thus effectively limiting the voltage seen by the circuit 78 under protection. On the other hand, when there is a negative voltage spike at the input/output pad the diode string 70, connecting the input/output pad 72 to $V_{SS}$ 76 is forward biased, limiting the magnitude of the negative voltage seen by the circuit 78 under protection. A diode string 70 is essentially formed of a series connection of diodes. In the present invention, the diodes 30 may be connected using an efficient layout with minimal area use, as illustrated in FIGS. 7A and 7B. In FIG. 7A, the cross-section of a diode string 70 is illustrated. The series connection of diodes is achieved by the conductor 58 which contacts both the p+ region 48 of a diode and the n+ region 46 of an adjacent diode. The layout of the diode string is illustrated in FIG. 7B.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A semiconductor diode
   a substrate;
   a fin formed of a semiconducting material positioned vertically on said substrate, said fin comprises a first heavily doped region of a first doping type on one side and a second heavily-doped region of a second doping type on an opposite side, wherein said fin having a width between about 50 angstroms and about 5000 angstroms; and
   a first conductor contacting said first heavily-doped region and a second conductor contacting said second heavily-doped region.

2. The semiconductor diode structure of claim 1, wherein said semiconducting material comprises silicon.

3. The semiconductor diode structure of claim 1, wherein said semiconducting material comprises silicon and germanium.

4. The semiconductor diode structure of claim 1, wherein said semiconducting material is a compound semiconductor.

5. The semiconductor diode structure of claim 1, wherein said substrate comprises a layer of an insulating material.

6. The semiconductor diode structure of claim 5, wherein said insulating material is silicon oxide.

7. The semiconductor diode structure of claim 5, wherein said insulating material is a dielectric selected from the group consisting of silicon nitride and aluminum oxide.

8. The semiconductor diode structure of claim 1, wherein said first doping type is formed using n-type dopant selected from the group consisting of phosphorus, arsenic and antimony.

9. The semiconductor diode structure of claim 1, wherein said second heavily-doped region of the second doping type is formed using p-type dopant selected from the group consisting of boron and indium.

10. The semiconductor diode structure of claim 1, wherein said first and second conductor is formed of a metal selected from the group consisting of tungsten and copper.

11. The semiconductor diode structure of claim 1, wherein said first and second conductor is formed of a metallic nitride selected from the group consisting of titanium nitride and tantalum nitride.

12. The semiconductor diode structure of claim 1, wherein said first and second conductor is formed of a heavily-doped semiconducting material.

13. The semiconductor diode structure of claim 1, wherein said first and second conductor is formed of p+ doped polysilicon.

14. The semiconductor diode structure of claim 1, wherein said first and second conductor comprises a first conductive layer underlying a second conductive layer.

15. The semiconductor diode structure of claim 14, wherein said first conductive layer is titanium nitride and said second conductive layer is tungsten.

16. The semiconductor diode structure of claim 1, wherein said fin having a height greater than about 200 angstroms.

17. The semiconductor diode structure of claim 1, wherein said first doping type is n+, said second doping type is p+ forming n+/p+ tunnel diode.

18. The semiconductor diode structure of claim 17, wherein a tunneling junction is formed between n+ and p+ regions.

19. The semiconductor diode structure of claim 1, wherein a dopant concentration in each of said n+ and p+ regions is greater than $10^{19}$ cm$^{-3}$.

20. The semiconductor diode structure of claim 1, wherein an etchant mask overlies said fin.

21. The semiconductor diode structure of claim 20, wherein said etchant mask comprises a dielectric material selected from the group consisting of silicon oxide, silicon nitride and silicon nitride on a silicon oxide stack.

22. The semiconductor diode structure of claim 1, wherein a silicide is formed in said first heavily-doped region and said second heavily-doped region.

23. The semiconductor diode structure of claim 22, wherein said silicide is selected from the group consisting of titanium silicide, cobalt silicide, nickel silicide and platinum silicide.

24. The semiconductor diode structure of claim 22, wherein a junction depth of said first or second heavily-doped region is greater than a silicide penetration depth by at least about 50 angstroms.

25. A semiconductor diode structure comprising:
   a substrate;
   a fin formed of a semiconducting material positioned vertically on said substrate, said fin comprises a first heavily-doped region of a first doping type on one side and a second heavily-doped region of a second doping type on an opposite side, and a lightly-doped body region situated in-between said first heavily-doped region and said second heavily-doped region, said fin having a width between about 50 angstroms and about 5000 angstroms; and a first conductor contacting said first heavily-doped region and a second conductor contacting said second heavily-doped region.

26. The semiconductor diode structure of claim 25, wherein said semiconducting material comprises silicon.

27. The semiconductor diode structure of claim 25, wherein said semiconducting material comprises silicon and germanium.

28. The semiconductor diode structure of claim 25, wherein said semiconducting material is a compound semiconductor.

29. The semiconductor diode structure of claim 25, wherein said substrate comprises a layer of an insulating material.

30. The semiconductor diode structure of claim 29, wherein said insulating material is silicon oxide.

31. The semiconductor diode structure of claim 29, wherein said insulating material is a dielectric selected from the group consisting of silicon nitride and aluminum oxide.

32. The semiconductor diode structure of claim 25, wherein said first doping type is formed using n-type dopant selected from the group consisting of phosphorus, arsenic and antimony.

33. The semiconductor diode structure of claim 25, wherein said second heavily-doped region of the second doping type is formed using p-type dopant selected from the group consisting of boron and indium.

34. The semiconductor diode structure of claim 25, wherein said first and second conductor is formed of a metal selected from the group consisting of tungsten and copper.

35. The semiconductor diode structure of claim 25, wherein said first and second conductor is formed of a metallic nitride selected from the group consisting of titanium nitride and tantalum nitride.

36. The semiconductor diode structure of claim 25, wherein said first and second conductor is formed of a heavily-doped semiconducting material.

37. The semiconductor diode structure of claim 25, wherein said first and second conductor is formed of p+ doped polysilicon.

38. The semiconductor diode structure of claim 25, wherein said first and second conductor comprises a first conductive layer underlying a second conductive layer.

39. The semiconductor diode structure of claim 37, wherein said first conductive layer is titanium nitride and said second conductive layer is tungsten.

40. The semiconductor diode structure of claim 25, wherein said fin having a height greater than about 200 angstroms.

41. The semiconductor diode structure of claim 25, wherein an etchant mask overlies said fin.

42. The semiconductor diode structure of claim 41, wherein said etchant mask comprises a dielectric material selected from the group consisting of silicon oxide, silicon nitride and silicon nitride on a silicon oxide stack.

43. The semiconductor diode structure of claim 25, wherein a silicide is formed in said first heavily-doped region and said second heavily-doped region.

44. The semiconductor diode structure of claim 43, wherein said silicide is selected from the group consisting of titanium silicide, cobalt silicide, nickel silicide and platinum silicide.

45. The semiconductor diode structure of claim 43, wherein a junction depth of said first or second heavily-doped region is greater than a silicide penetration depth by at least about 50 angstroms.

46. A semiconductor diode string comprising:
a substrate;
a plurality of fins situated side-by-side on said substrate each formed of a semiconducting material and each having a first heavily-doped region of a first doping type on one side and a second heavily-doped region of a second doping type on an opposite side, said fin having a width between about 50 angstroms and about 5000 angstroms; and
a conductor contacting said first heavily-doped region in each of said plurality of fins and said second heavily-doped region of an adjacent fin.

47. The semiconductor diode string of claim 46, wherein said semiconducting material comprises silicon.

48. The semiconductor diode string of claim 46, wherein said semiconducting material comprises silicon and germanium.

49. The semiconductor diode string of claim 46, wherein said semiconducting material is a compound semiconductor.

50. The semiconductor diode string of claim 46, wherein said substrate comprises a layer of an insulating material.

51. The semiconductor diode string of claim 50, wherein said insulating material is silicon oxide.

52. The semiconductor diode string of claim 50, wherein said insulating material is a dielectric selected from the group consisting of silicon nitride and aluminum oxide.

53. The semiconductor diode string of claim 46, wherein said first doping type is formed using n-type dopant selected from the group consisting of phosphorus, arsenic and antimony.

54. The semiconductor diode string of claim 46, wherein said second heavily-doped region of the second doping type is formed using p-type dopant selected from the group consisting of boron and indium.

55. The semiconductor diode string of claim 46, wherein said first and second conductor is formed of a metal selected from the group consisting of tungsten and copper.

56. The semiconductor diode string of claim 46, wherein said first and second conductor is formed of a metallic nitride selected from the group consisting of titanium nitride and tantalum nitride.

57. The semiconductor diode string of claim 46, wherein said first and second conductor is formed of a heavily-doped semiconducting material.

58. The semiconductor diode string of claim 46, wherein said first and second conductor is formed of p+ doped polysilicon.

59. The semiconductor diode string of claim 46, wherein said first and second conductor comprises a first conductive layer underlying a second conductive layer.

60. The semiconductor diode string of claim 58, wherein said first conductive layer is titanium nitride and said second conductive layer is tungsten.

61. The semiconductor diode string of claim 46, wherein said fin having a height greater than about 200 angstroms.

62. The semiconductor diode string of claim 46, wherein an etchant mask overlies each one of said plurality of fins.

63. The semiconductor diode string of claim 62, wherein said etchant mask comprises a dielectric material selected from the group consisting of silicon oxide, silicon nitride and silicon nitride on a silicon oxide stack.

64. The semiconductor diode string of claim 46, wherein a silicide is formed in said first heavily-doped region and said second heavily-doped region.

65. The semiconductor diode string of claim 64, wherein said silicide is selected from the group consisting of titanium, silicide, cobalt silicide, nickel silicide and platinum silicide.

66. The semiconductor diode string of claim 64, wherein a junction depth of said first or second heavily-doped region is greater than a silicide penetration depth by at least about 50 angstroms.

* * * * *